(12) United States Patent
Sawamura et al.

(10) Patent No.: US 10,556,446 B2
(45) Date of Patent: Feb. 11, 2020

(54) IMAGE RECORDING DEVICE AND IMAGE RECORDING METHOD

(71) Applicant: Ricoh Company, Ltd., Tokyo (JP)

(72) Inventors: Ichiro Sawamura, Shizuoka (JP);
Yoshihiko Hotta, Shizuoka (JP);
Kazuyuki Uetake, Shizuoka (JP);
Tomomi Ishimi, Shizuoka (JP);
Yasuroh Yokota, Shizuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/045,003

(22) Filed: Jul. 25, 2018

(65) Prior Publication Data

US 2018/0326744 A1  Nov. 15, 2018

Related U.S. Application Data

(63) Continuation of application No. PCT/JP2017/003671, filed on Feb. 1, 2017.

(30) Foreign Application Priority Data

Feb. 5, 2016  (JP) .................................. 2016-021353
Jan. 31, 2017  (JP) .................................. 2017-016026

(51) Int. Cl.
*B41J 2/455* (2006.01)
*B41J 2/47* (2006.01)
(Continued)

(52) U.S. Cl.
CPC .............. *B41J 2/455* (2013.01); *B41J 2/473* (2013.01); *B41J 2/4753* (2013.01); *B41M 5/305* (2013.01);
(Continued)

(58) Field of Classification Search
CPC ..... B41J 2/473; B41J 2/46; B41J 2/447; B41J 2/455; B41J 2/471; G02B 6/3839
See application file for complete search history.

(56) References Cited

U.S. PATENT DOCUMENTS 5,109,460 A    4/1992  Baek et al.
5,327,263 A *  7/1994  Katagiri .................. G02F 1/135
                                                 348/761
(Continued)

FOREIGN PATENT DOCUMENTS

CN   101032879 A    9/2007
JP   58-148777      9/1983
(Continued)

OTHER PUBLICATIONS

International Search Report dated Mar. 28, 2017 in PCT/JP2017/003671 filed Feb. 1, 2017.
(Continued)

*Primary Examiner* — John Zimmermann
(74) *Attorney, Agent, or Firm* — Xsensus LLP

(57) ABSTRACT

An image recording device includes a laser irradiation device that emits laser lights output from a plurality of laser light emitting elements to different positions in a predetermined direction; and an image recording unit that controls the laser irradiation device to irradiate a recording object moving relative to the laser irradiation device in a direction different from the predetermined direction with laser so as to heat the object, form image dots, and record an image. The image recording unit controls the laser irradiation device, conducts recording such that at least one of the image dots, recorded alongside at different positions in a direction perpendicular to a relative moving direction of the object, is shifted relative to other ones of the image dots in the relative moving direction, and records a solid image on the object (Continued)

such that the image dot is partially overlapped with all adjacent image dots.

20 Claims, 9 Drawing Sheets

(51) Int. Cl.
    *B41J 2/475*     (2006.01)
    *B41M 5/30*     (2006.01)
    *B41J 2/46*     (2006.01)
    *G02B 6/38*     (2006.01)
    *H01S 5/024*     (2006.01)
    *H01S 5/042*     (2006.01)

(52) U.S. Cl.
    CPC .............. *B41J 2/46* (2013.01); *G02B 6/3839* (2013.01); *H01S 5/02415* (2013.01); *H01S 5/042* (2013.01)

(56) References Cited

U.S. PATENT DOCUMENTS

| | | | | |
|---|---|---|---|---|
| 5,463,720 | A * | 10/1995 | Granger | H04N 1/4058 358/1.9 |
| 5,966,394 | A | 10/1999 | Spurr et al. | |
| 7,944,463 | B2 * | 5/2011 | Toyama | G03G 15/0409 347/243 |
| 2002/0015088 | A1 | 2/2002 | Inoue et al. | |
| 2002/0164157 | A1 * | 11/2002 | Hori | G02B 5/10 386/358 |
| 2003/0210928 | A1 * | 11/2003 | Miyaguchi | G03G 15/08 399/252 |
| 2004/0032483 | A1 * | 2/2004 | Itabashi | B41J 2/473 347/238 |
| 2004/0246330 | A1 * | 12/2004 | Hayashi | G06K 15/1223 347/243 |
| 2011/0090299 | A1 | 4/2011 | Asai et al. | |

FOREIGN PATENT DOCUMENTS

| | | |
|---|---|---|
| JP | 05-281423 | 10/1993 |
| JP | 06-253090 | 9/1994 |
| JP | 07-068821 | 3/1995 |
| JP | 08-281994 | 10/1996 |
| JP | 11-070699 | 3/1999 |
| JP | 2005-111982 | 4/2005 |
| JP | 2006-347179 | 12/2006 |
| JP | 2010-052350 | 3/2010 |
| JP | 2011-104994 | 6/2011 |

OTHER PUBLICATIONS

Written Opinion dated Mar. 28, 2017 in PCT/JP2017/003671 filed Feb. 1, 2017.
Notification of First Office Action dated Apr. 26, 2019, issued in corresponding Chinese Patent Application No. 2017800094848 (with English translation) 16 pages.

* cited by examiner

IMAGE RECORDING DEVICE AND IMAGE RECORDING METHOD

CROSS-REFERENCE TO RELATED APPLICATIONS

This application is a continuation of PCT international application Ser. No. PCT/JP2017/003671 filed on Feb. 1, 2017 which designates the United States, incorporated herein by reference, and which claims the benefit of priority from Japanese Patent Applications No. 2016-021353, filed on Feb. 5, 2016 and Japanese Patent Applications No. 2017-016026, filed on Jan. 31, 2017, incorporated herein by reference.

BACKGROUND OF THE INVENTION

1. Field of the Invention

Embodiments relate to an image recording device and an image recording method.

2. Description of the Related Art

There are conventionally known image recording devices that irradiate a recording object with laser to heat the recording object so as to record visible images on the recording object.

As the above-described image recording device, for example, Japanese Laid-open Patent Publication No. 2010-52350 discloses an image recording device that includes a laser irradiation device, such as a laser array, in which multiple semiconductor lasers, which are laser light emitting elements, are arranged in array and laser lights output from the respective semiconductor lasers are emitted to different positions in a predetermined direction.

Unfortunately, the image recording device disclosed in Japanese Laid-open Patent Publication No. 2010-52350 has a problem in that when a solid image is recorded on a recording object, voids occur on the solid image, the solid image has an area where its image density is low, or burning occurs on the recording object. Furthermore, there is a problem in that the image density is decreased when there are changes in the resolution of images recorded on a recording object or the distance between the image recording device and a recording object.

In view of the conventional problem, there is a need to provide an image recording device and an image recording method that makes it possible to prevent voids on solid images, prevent the occurrence of an area where its image density is low or burning of a recording object, improve the resolution of images recorded on a recording object, and prevent a decrease in the image density due to changes in the distance between the image recording device and a recording object.

SUMMARY OF THE INVENTION

According to an embodiment, the present invention provides an image recording device that includes a laser irradiation device, and an image recording unit. The laser irradiation device is configured to emit laser lights output from a plurality of laser light emitting elements to different positions in a predetermined direction. The image recording unit is configured to control the laser irradiation device to irradiate a recording object moving relative to the laser irradiation device in a direction different from the predetermined direction with laser so as to heat the recording object, form image dots, and record an image. In the image recording device, the image recording unit controls the laser irradiation device, conducts recording such that at least one of the image dots, recorded alongside at different positions in a direction perpendicular to a relative moving direction of the recording object, is shifted relative to other ones of the image dots in the relative moving direction, and records a solid image on the recording object such that the image dot is partially overlapped with all adjacent image dots.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENTS

Figure 1:
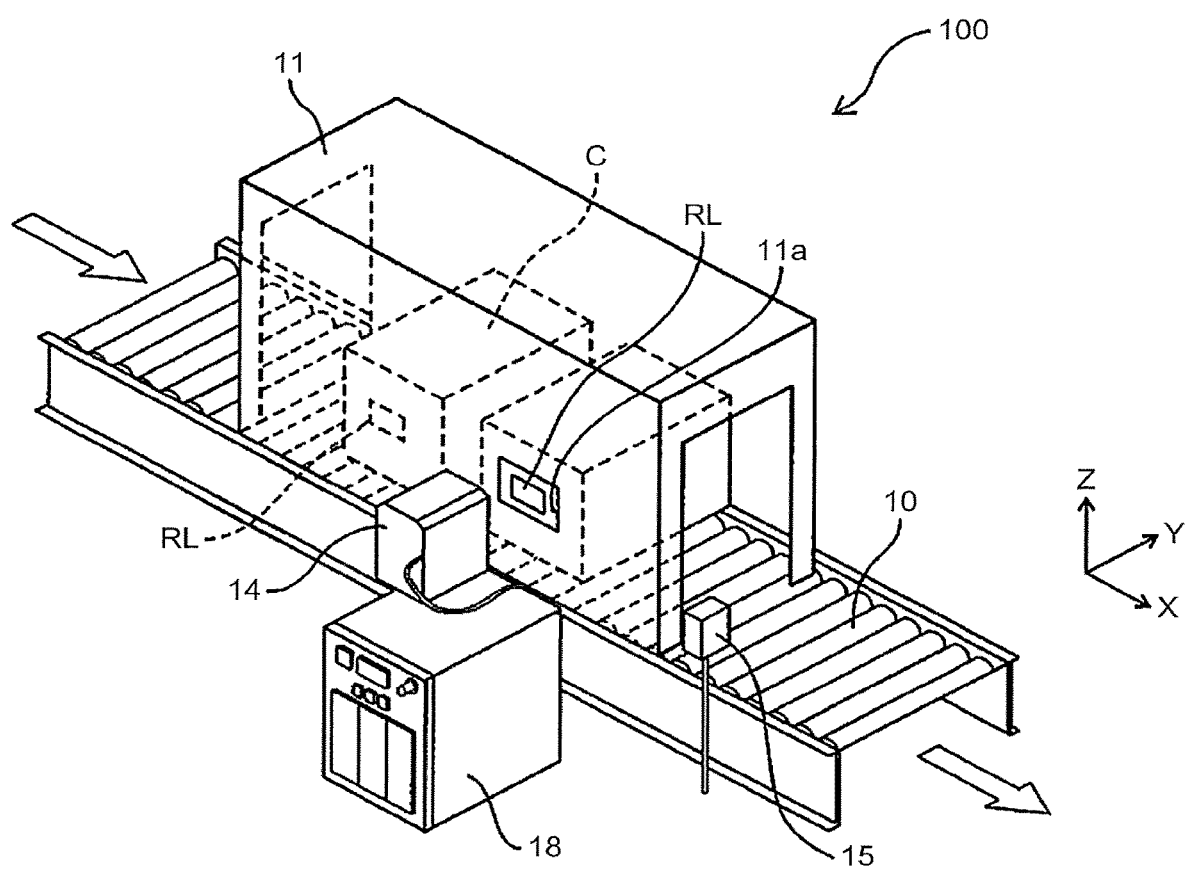
FIG. 1 is a schematic perspective view of an image recording system according to an embodiment.

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

An explanation is given below of an embodiment of an image recording device to which the present invention is applied. The image recording device irradiates a recording object with laser light to conduct image recording.

There is no particular limitation on the image as long as it is viewable information, and it is appropriately selectable depending on a purpose. The image includes, for example, texts, symbols, lines, graphics, solid images, or combination thereof, or two-dimensional codes such as bar codes or QR codes (registered trademark).

Furthermore, there is no particular limitation on the recording object image as long as it is recordable by using laser light, and it is appropriately selectable depending on a purpose. Any recording objects may be used as long as it absorbs light and converts it into heat so as to form images, and it includes for example engraved marks on metal. Moreover, the recording object includes, for example, thermal recording media or structures including a thermal recording portion.

The thermal recording medium includes a base, an image recording layer on the base and, if needed, other layers. Each layer may have a single layer structure or a laminate structure, or it may be provided on the other side of the base.

Image Recording Layer

The image recording layer contains leuco dye, developer and, if needed, other components.

There is no particular limitation on the leuco dye, and it is appropriately selectable from the ones typically used in thermal recording materials depending on a purpose; for example, it is preferable to use a leuco compound of dyes of triphenylmethane series, fluoran series, phenothiazine series, auramine series, spiropyran series, indolinone phthalide series, or the like.

As the developer, various electron-accepting compounds, oxidizing agent, or the like, which produce color with the leuco dye upon contact are applicable.

The other components include binder resin, photothermal materials, thermal-melting substances, antioxidant, light stabilizers, surfactants, lubricants, loading materials, or the like.

Base

There is no particular limitation on the base with regard to its shape, structure, size, or the like, and it is appropriately selectable depending on a purpose; the shape includes for example a flat-plate like shape, the structure may be a single layer structure or a laminate structure, and the size is appropriately selectable in accordance with the size, or the like, of the thermal recording medium.

Other Layers

The other layers include a photothermal layer, a protective layer, an under layer, an ultraviolet absorbing layer, an oxygen insulating layer, an intermediate layer, a back layer, an adhesive layer, a gluing layer, or the like.

The thermal recording medium may be processed into a desired shape depending on its use application. The shape includes, for example, a card-like shape, a tag-like shape, a label-like shape, a sheet-like shape, or a roll shape.

The one processed into a card-like shape includes, for example, prepaid cards, discount cards, or credit cards. The one processed into a tag-like shape with a size smaller than that of cards may be used as price tags, or the like. Furthermore, the one processed into a tag-like shape with a size larger than that of cards may be used for process management, shipment instructions, tickets, or the like. As the one processed like a label is adhesive, it is processed into various sizes so that it may be attached to carriages, packages, boxes, containers, or the like, which are repeatedly used, and may be used for process management, product management, or the like. Moreover, the one processed like a sheet with a size larger than that of cards is usable as general documents, instructions for process management, or the like, as there are wider areas for recording images.

The thermal recording portion included in the structure includes, for example, a portion where the label-like thermal recording medium is attached to a surface of the structure or a portion where thermal recording material is applied to a surface of the structure. Furthermore, there is no particular limitation on the structure including the thermal recording portion as long as a thermal recording portion is provided on a surface of the structure, and it is appropriately selectable depending on a purpose. The structure including the thermal recording portion includes, for example, various products such as plastic bags, PET bottles, or cans, transport cases such as cardboard boxes or containers, products in process, or industrial products.

For example, an explanation is given below of an image recording device that records images on a structure including a thermal recording portion, which is a recording object, e.g., a transport container with a thermal recording label attached thereto.

FIG. 1 is a schematic perspective view of an image recording system 100 that is an image recording device according to an embodiment. In the following explanation, the conveying direction of a container C for transport is an X-axis direction, a vertical direction is a Z-axis direction, and a direction perpendicular to the conveying direction and the vertical direction is a Y-axis direction.

As described below in detail, the image recording system 100 irradiates a thermal recording label RL attached to the container C for transport, which is a recording object, with laser light to record images.

As illustrated in FIG. 1, the image recording system 100 includes a conveyor device 10, which is a recording-object conveyor unit, a recording device 14, a system control device 18, a reading device 15, a shield cover 11, and the like.

The recording device 14 irradiates the thermal recording label RL with laser light to record images, which are visible images, on the recording object. The recording device 14 is located on the −Y side of the conveyor device 10, i.e., the −Y side of the conveyance path.

The shield cover 11 shields laser light emitted from the recording device 14 to reduce diffusion of laser light, and its surface is coated with black alumite. An opening section 11a for passing laser light is formed on an area of the shield cover 11 opposed to the recording device 14. Furthermore, although the conveyor device 10 is a conveyor roller according to the present embodiment, it may be a conveyor belt.

The system control device 18 is connected to the conveyor device 10, the recording device 14, the reading device 15, and the like, and it performs overall control of the image recording system 100. Furthermore, as described later, the reading device 15 reads code images such as bar codes or QR codes recorded on the recording object. The system control device 18 checks whether images are properly recorded on the basis of information read by the reading device 15.

Here, an explanation is given of the thermal recording label RL attached to the container C. The thermal recording label RL is a thermal recording medium, and images are recorded by changing color tone with heat. According to the present embodiment, although a thermal recording medium for conducting one-time image recording is used as the thermal recording label RL, a thermoreversible recording medium enabling recording multiple times may be used as the thermal recording label RL.

The thermal recording medium used as the thermal recording label RL according to the present embodiment includes a material (photothermal material) that absorbs laser light and converts it into heat; and a material that has changes in hue, reflectance, or the like, due to heat.

Photothermal materials may be broadly divided into inorganic materials and organic materials. The inorganic materials include, for example, at least any particles of carbon black, metallic boride, and metallic oxide such as Ge, Bi, In, Te, Se, or Cr. The inorganic material is preferably a material that highly absorbs light at a near-infrared wavelength area and that less absorbs light at a visual-range wavelength area, and it is preferably metallic boride and metallic oxide described above. The inorganic material is preferably at least one type selected from, for example, hexaboride, tungsten oxide compound, antimony tin oxide (ATO), indium tin oxide (ITO), and zinc antimonate.

Hexaboride described above includes, for example, $LaB_6$, $CeB_6$, $PrB_6$, $NdB_6$, $GdB_6$, $TbB_6$, $DyB_6$, $HoB_6$, $YB_6$, $SmB_6$, $EuB_6$, $ErB_6$, $TmB_6$, $YbB_6$, $LuB_6$, $SrB_6$, $CaB_6$, or $(La,Ce)B_6$.

Tungsten oxide compound described above includes, for example, fine particles of tungsten oxide represented by the general expression: $WyOz$ (here, W is tungsten, O is oxygen, and $2.25 \leq z/y \leq 2.999$) disclosed in International Publication Pamphlet No. 2005/037932, Japanese Laid-open Patent Publication No. 2005-187323, or the like; fine particles of composite tungsten oxide represented by the general expression: $MxWyOz$ (here, M is one or more types of elements selected from H, He, alkali metal, alkali earth metal, rare-earth element, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi, and I, W is tungsten, O is oxygen, and $0.001 \leq x/y \leq 1$, $2.25 \leq z/y \leq 3.0$); and the like.

Among them, as the above-described tungsten oxide compound, cesium-containing tungsten oxide is particularly preferable in terms of high absorption at a near-infrared area and low absorption at an invisible area.

Furthermore, among the above-described antimony tin oxide (ATO), the above-described indium tin oxide (ITO), and the above-described zinc antimonate, ITO is particularly preferable as the above-described tungsten oxide compound in terms of high absorption at a near-infrared area and low absorption at an invisible area. They are formed into a layer by a vacuum vapor deposition method or by attaching particulate material with resin, or the like.

As the above-described organic material, various dyes may be appropriately used in accordance with the light wavelength to be absorbed, and when a semiconductor laser is used as a light source, a near-infrared absorbing dye having an absorption peak near 600 nm to 1,200 nm is used. Specifically, the above-described organic material includes cyanine dye, quinone-based dye, quinoline derivative of indonaphthol, phenylenediamine-based nickel complex, phthalocyanine-based dye, or the like.

As the above-described photothermal material, one type may be used alone, or two or more types may be used in combination. Furthermore, the photothermal material may be provided in an image recording layer or may be provided in other than an image recording layer. When the photothermal material is used for other than the image recording layer, it is preferable that a photothermal layer is provided adjacent to a thermoreversible recording layer.

The photothermal layer includes at least the above-described photothermal material and binder resin.

As the material that has changes in hue, reflectance, or the like, due to heat, for example, known materials may be used, such as the combination of an electron-donating dye precursor and an electron-accepting developer used for conventional thermal paper. Furthermore, the material that has changes in hue, reflectance, or the like, due to heat, includes material that has changes such as composite reaction of heat and light, e.g., color change reaction in accordance with solid-phase polymerization due to heating of diacetylene-based compound and irradiation of ultraviolet light.

Figure 2:
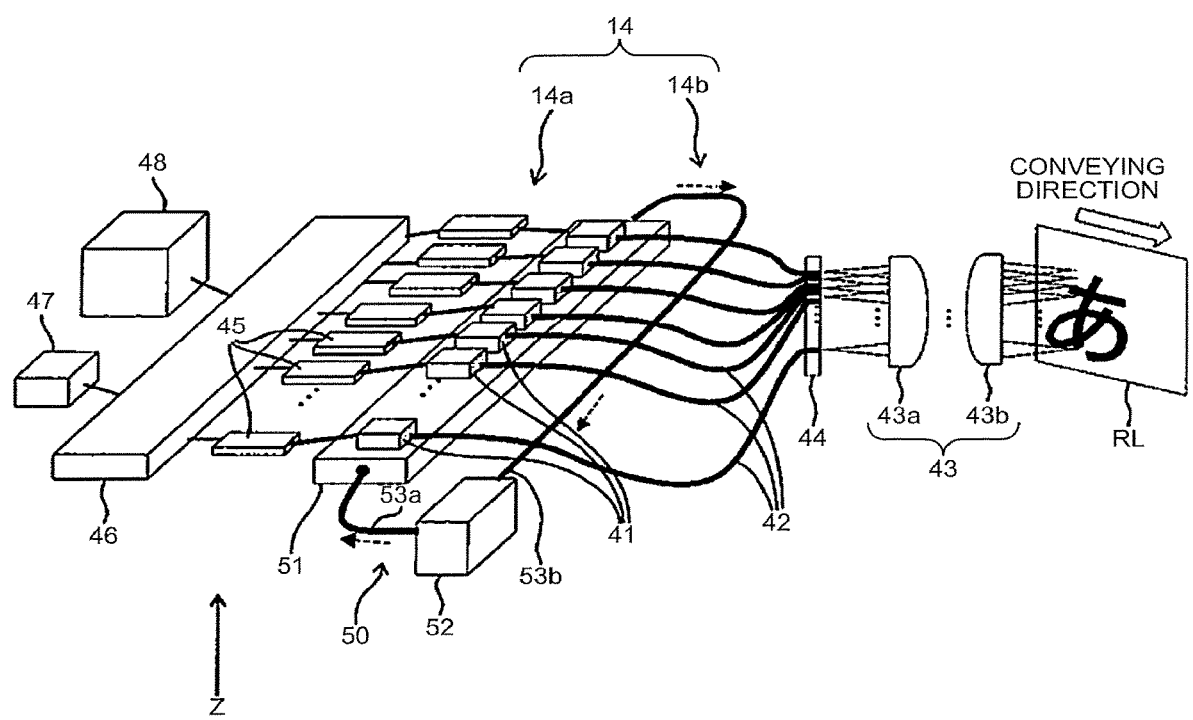
FIG. 2 is a schematic perspective view that illustrates a configuration of a recording device.

FIG. 2 is a schematic perspective view that illustrates a configuration of the recording device 14. According to the present embodiment, as the recording device 14, a fiber-array recording device is used, which records images by using a fiber array in which optical-fiber laser output portions are arranged in array in a main scanning direction (the Z-axis direction) perpendicular to a sub-scanning direction (the X-axis direction) that is a moving direction of the container C that is the recording object. The fiber-array recording device irradiates the recording object with laser light output from the laser light emitting element via the fiber array, thereby recording images in units of drawings. Specifically, the recording device 14 includes a laser array unit 14a, a fiber array unit 14b, and an optical unit 43. The laser array unit 14a includes a plurality of laser light emitting elements 41 that is arranged in array; a cooling unit 50 that cools the laser light emitting elements 41; actuation drivers 45 that are provided corresponding to the laser light emitting elements 41 and drive the corresponding laser light emitting elements 41; and a controller 46 that controls the actuation drivers 45. The controller 46 is connected to a power source 48 that supplies electric power to the laser light emitting element 41; and an image-information output unit 47, such as personal computer, which outputs image information.

The laser light emitting element 41 is appropriately selectable depending on a purpose, and for example a semiconductor laser, solid-state laser, dye laser, or the like, may be used. Among them, the laser light emitting element 41 is preferably a semiconductor laser because it has wide wavelength selectivity, it is small-sized so that a reduction in the size of the device is possible, and costs may be reduced.

Furthermore, there is no particular limitation on the wavelength of the laser light output from the laser light emitting element 41, and it is appropriately selectable depending on a purpose; however, it is preferably 700 nm to 2000 nm, and more preferably 780 nm to 1600 nm.

With the laser light emitting element 41 that is an output unit, all the energy applied is not converted into laser light. Typically, with the laser light emitting element 41, energy that is not converted into laser light is converted into heat so that heat is generated. Therefore, the cooling unit 50, which is a cooling unit, cools the laser light emitting element 41. Furthermore, according to the present embodiment, the recording device 14 uses the fiber array unit 14b so that each of the laser light emitting elements 41 may be located apart from each other. Thus, effects of heat from the adjacent laser light emitting elements 41 may be reduced, and the laser light emitting elements 41 may be cooled efficiently, whereby increases or fluctuations in the temperature of the laser light emitting elements 41 may be prevented, fluctuations in output of laser light may be reduced, and improvements may be made for uneven density and voids.

Here, output of laser light is the average output measured by a power meter. There are two types of methods for controlling output of laser light, a method for controlling peak power and a method for controlling a pulse emission ratio (duty: a laser emission time/a period time).

The cooling unit 50 is a liquid cooling system for circulating coolant to cool the laser light emitting elements 41, and it includes a heat receiving unit 51 in which coolant receives heat from each of the laser light emitting elements 41; and a heat releasing unit 52 that releases heat from the coolant. The heat receiving unit 51 and the heat releasing unit 52 are connected with cooling pipes 53*a*, 53*b*. The heat receiving unit 51 is provided with a cooling tube that is made of a material with desired heat conductivity for flowing coolant inside a chassis that is made of a material with desired heat conductivity. The laser light emitting elements 41 are arranged in array on the heat receiving unit 51.

The heat releasing unit 52 includes a radiator and a pump for circulating coolant. After the coolant is delivered by the pump in the heat releasing unit 52, it passes through the cooling pipe 53*a* and flows into the heat receiving unit 51. Then, it moves through the cooling tube inside the heat receiving unit 51 while releasing heat from the laser light emitting elements 41 arranged on the heat receiving unit 51 to cool the laser light emitting elements 41. After flowing out of the heat receiving unit 51, the coolant with a temperature increased due to heat released from the laser light emitting elements 41 moves inside the cooling pipe 53*b* and flows into the radiator in the heat releasing unit 52 so that it is cooled by the radiator. The coolant cooled by the radiator is again delivered to the heat receiving unit 51 by the pump.

The fiber array unit 14*b* includes an array head 44 that supports optical fibers 42 provided corresponding to the laser light emitting elements 41 and the vicinity of laser output portions 42*a* (see FIG. 3B) of the optical fibers 42 in array in a vertical direction (the Z-axis direction). The laser incident portion of each of the optical fibers 42 is attached to the laser output surface of the corresponding laser light emitting element 41.

Figure 3A:
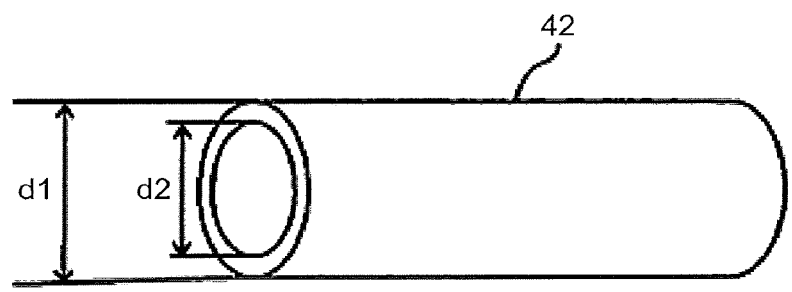
FIG. 3A is an enlarged schematic view of an optical fiber.
Figure 3B:
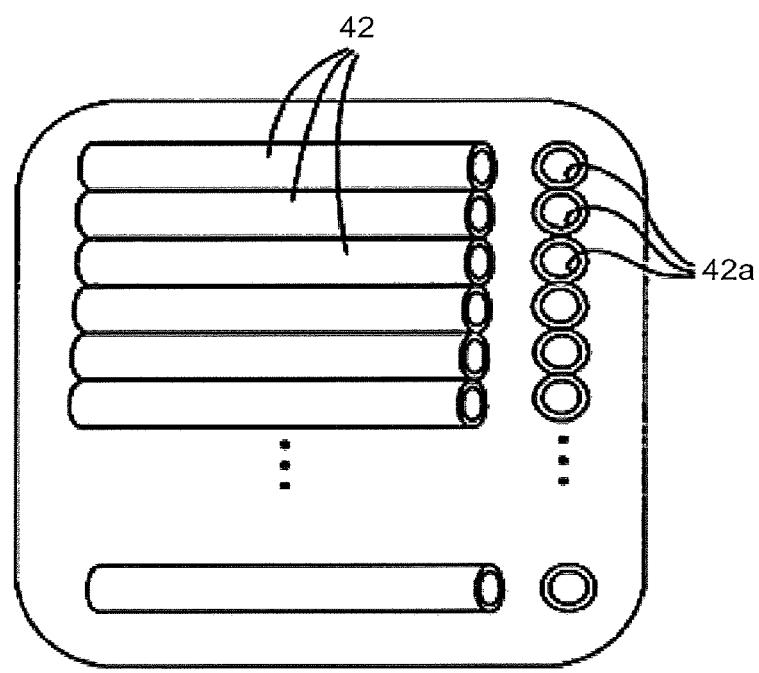
FIG. 3B is an enlarged view of the vicinity of an array head.

FIG. 3A is an enlarged schematic view of the optical fiber 42, and FIG. 3B is an enlarged view of the vicinity of the array head 44.

The optical fiber 42 is an optical waveguide for laser light output from the laser light emitting element 41. There is no particular limitation on the shape, size (diameter), material, structure, or the like, of the optical fiber 42, and it is appropriately selectable depending on a purpose.

It is preferable that the size (a diameter d1) of the optical fiber 42 is equal to or more than 15 μm and equal to or less than 1000 μm. When the diameter d1 of the optical fiber 42 is equal to or more than 15 μm and equal to or less than 1000 μm, it is advantageous in terms of image definition. According to the present embodiment, an optical fiber with a diameter of 125 μm is used as the optical fiber 42.

Furthermore, there is no particular limitation on the material of the optical fiber 42, and it is appropriately selectable depending on a purpose; for example, glass, resin, quartz, and the like, are included.

The structure of the optical fiber 42 is preferably the structure including a core portion at the center through which laser light passes; and a cladding layer that is provided on the outer circumference of the core portion.

There is no particular limitation on a diameter d2 of the core portion, and it is appropriately selectable depending on a purpose; however, it is preferably equal to or more than 10 μm and equal to or less than 500 μm. According to the present embodiment, an optical fiber having a core portion with the diameter d2 of 105 μm is used. Furthermore, there is no particular limitation on the material of the core portion, and it is appropriately selectable depending on a purpose; for example, germanium or phosphorus-doped glass, and the like, are included.

There is no particular limitation on the average thickness of the cladding layer, and it is appropriately selectable depending on a purpose; however, it is preferably equal to or more than 10 μm and equal to or less than 250 μm. There is no particular limitation on the material of the cladding layer, and it is appropriately selectable depending on a purpose. The material of the cladding layer includes, for example, boron or fluorine-doped glass.

As illustrated in FIG. 3B, the array head 44 supports the vicinity of the laser output portions 42*a* of the optical fibers 42 in array such that the pitch between the laser output portions 42*a* in the respective optical fibers 42 is 127 μm. In the recording device 14, the pitch between the laser output portions 42*a* is 127 μm so that images with a resolution of 200 dpi are recordable.

When the single array head 44 holds all the optical fibers 42, the array head 44 is elongated and it is likely to be deformed. As a result, it is difficult to keep the linearity of beam array and evenness of beam pitch with the single array head 44. For this reason, the array head 44 holds the 100 to 200 optical fibers 42. In addition, in the recording device 14, it is preferable that the array heads 44 each holding the 100 to 200 optical fibers 42 are arranged alongside in the Z-axis direction that is a direction perpendicular to the conveying direction of the container C. According to the present embodiment, the 100 array heads 44 are arranged in the Z-axis direction.

Figure 4A:
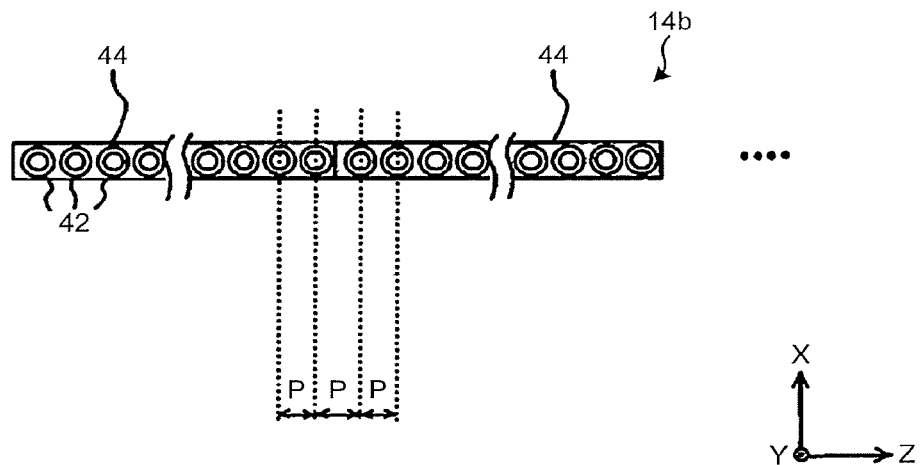
FIG. 4A is a diagram that illustrates an example of arrangement of the array heads.
Figure 4B:
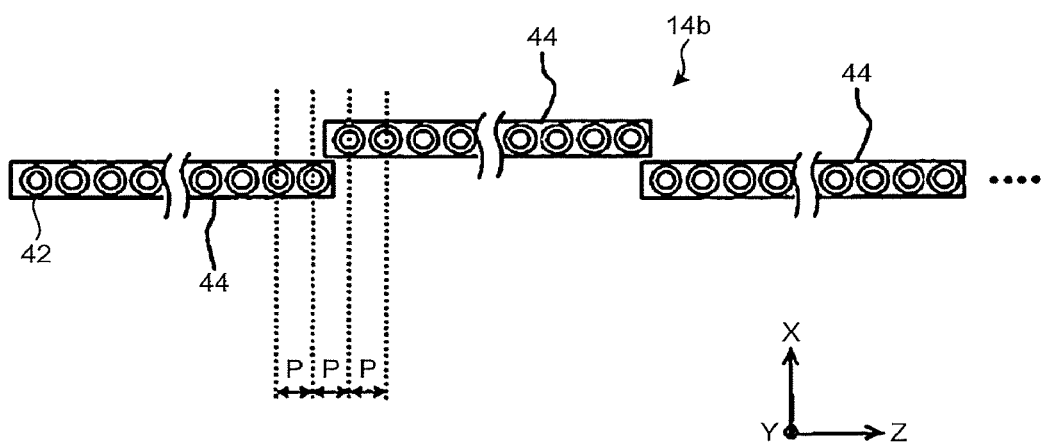
FIG. 4B is a diagram that illustrates an example of arrangement of the array heads.

FIG. 4A to FIG. 4E are diagrams that illustrate examples of arrangement of the array heads 44. FIG. 4A is an example of the array heads 44 of the fiber array unit 14*b* arranged in array in the Z-axis direction in the recording device 14. FIG. 4B is an example of the array heads 44 of the fiber array unit 14*b* arranged in zigzags in the recording device 14. In terms of assembly, it is more preferable that the array heads 44 are arranged in zigzags as illustrated in FIG. 4B than it is arranged linearly in the Z-axis direction as illustrated in FIG. 4A.

Furthermore, conventionally, the resolution of images recorded is determined in accordance with the pitch distance for laser irradiation on a recording object. Conversely, with the recording device 14, the pitch distance is determined in accordance with the fiber diameter of the optical fiber 42. For this reason, when laser light emitted from each of the optical fibers 42 is focused onto the thermal recording label RL attached to the container C for transport, which is a recording object, the pitch of the optical fibers 42 is the resolution of an image. In this case, the fiber diameter of the optical fiber 42 is smaller, high output is more difficult; therefore, the objective is to achieve both high resolution and high speed recording, which depends on laser output.

Figure 4C:
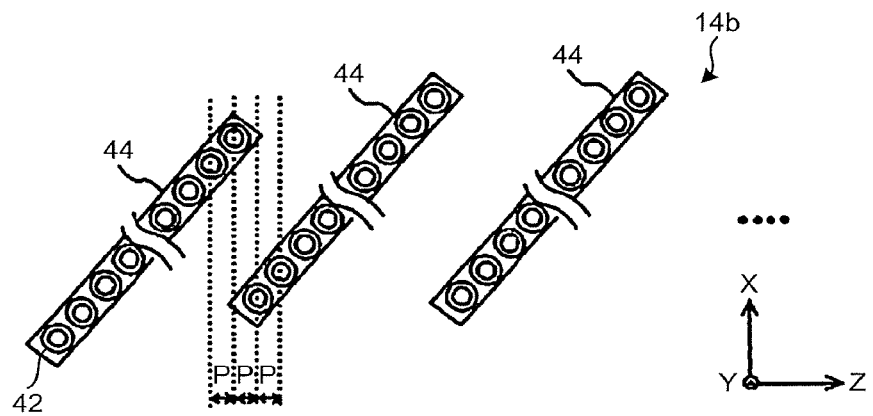
FIG. 4C is a diagram that illustrates an example of arrangement of the array heads.

FIG. 4C is an example where the array heads 44 of the fiber array unit 14*b* in the recording device 14 are arranged by being tilted in the X-axis direction. By arranging the array heads 44 as illustrated in FIG. 4C, a pitch P between the optical fibers 42 in the Z-axis direction may be narrower than that illustrated in FIG. 4A or FIG. 4B, whereby an increase in resolution may be achieved.

Figure 4D:
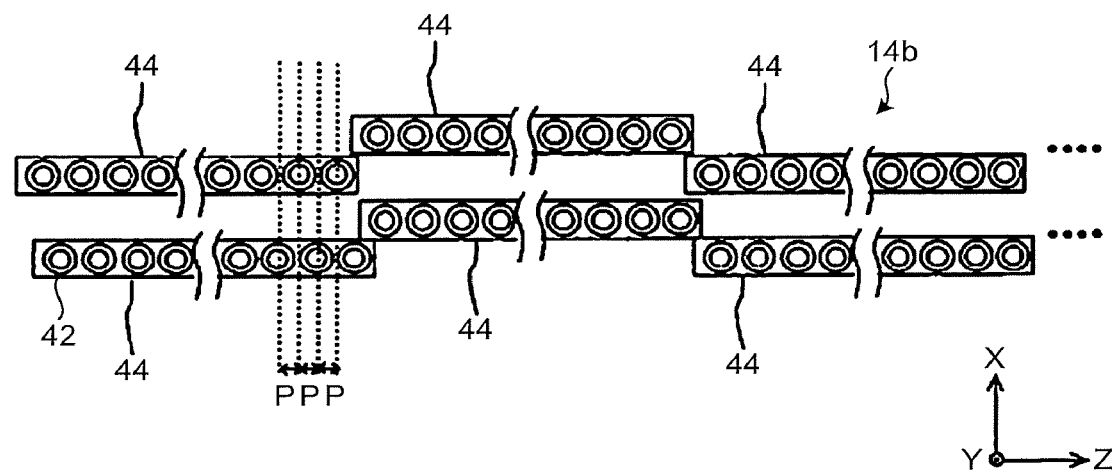
FIG. 4D is a diagram that illustrates an example of arrangement of the array heads.

Furthermore, FIG. 4D is an example where two groups of array heads, the array heads 44 of the fiber array unit 14*b* in the recording device 14 arranged in zigzags, are provided in the sub-scanning direction (the X-axis direction), and one of the array head groups is shifted with respect to the other one of the array head groups in the main scanning direction (the Z-axis direction) by half the array pitch of the optical fiber 42 in the array head 44. By arranging the array heads 44 as illustrated in FIG. 4D, the pitch P of the optical fiber 42 in the Z-axis direction may be narrower than that in the arrangement illustrated in FIG. 4A or FIG. 4B, whereby an increase in resolution may be achieved.

Furthermore, under the control of the system control device 18, the recording device 14 according to the present embodiment transmits and records image information in a direction perpendicular to the scanning direction of the thermal recording label RL attached to the container C for transport, which is a recording object. Therefore, if there is a difference in timing for scanning the thermal recording label RL and transmitting image information in a perpendicular direction, the recording device 14 stores image information in a memory, and therefore the amount of image stored is increased. In this case, the amount of information stored in the memory of the system control device 18 may be reduced with the example of the arrangement of the array heads 44 illustrated in FIG. 4D as compared with the example of the arrangement of the array heads 44 illustrated in FIG. 4B.

Figure 4E:
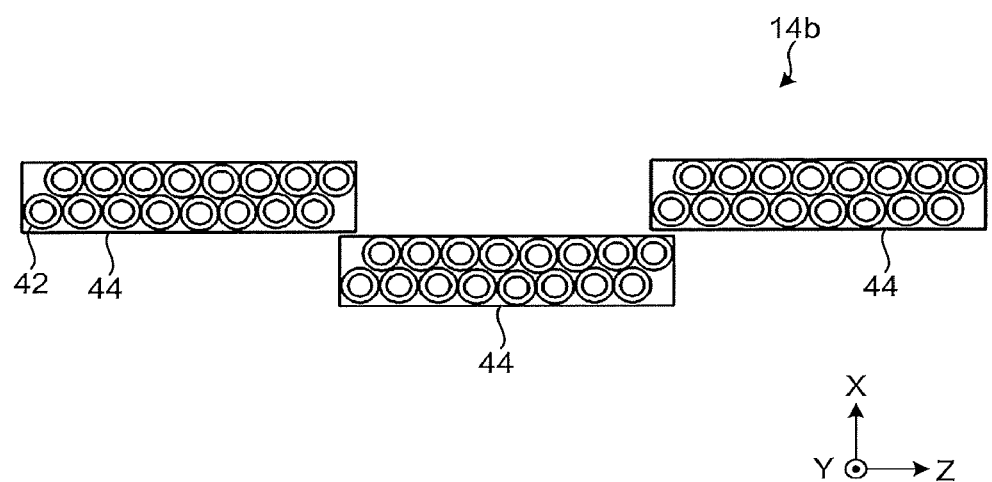
FIG. 4E is a diagram that illustrates an example of arrangement of the array heads.

Furthermore, FIG. 4E is an example where the two groups of array heads illustrated in FIG. 4D, in which the array heads 44 are arranged in zigzags, is laminated as a single array head group. The array heads 44 laminated as a single array head group instead of two array head groups may be easily manufactured, and an increase in resolution may be achieved. In addition, the amount of information stored in a memory of the system control device 18 may be reduced with the example of the arrangement of the array heads 44 illustrated in FIG. 4E than the example of the arrangement of the array heads 44 illustrated in FIG. 4D.

Furthermore, as illustrated in FIG. 2 described above, the optical unit 43 includes a collimator lens 43a that converts laser light, which is diverging light, output from each of the optical fibers 42 into parallel light; and a condenser lens 43b that focuses laser light onto a surface of the thermal recording label RL that is a laser irradiation surface. Furthermore, depending on a purpose, it is appropriately selectable whether the optical unit 43 is provided.

According to a generally-used method, images are transferred onto the thermal recording label RL attached to the container C for transport, which is a recording object, at 1:1 by the optical unit 43 with laser light output from each of the optical fibers 42 of the array heads 44. Furthermore, with this method, laser light is focused and emitted to the thermal recording label RL attached to the container C for transport, which is a recording object, in accordance with the spread angle (NA) of laser light output from each of the optical fibers 42 in the array heads 44. Therefore, the condensing angle of the thermal recording label RL is the same as the condensing angle (NA) of laser light. Therefore, when the condensing angle (NA) of laser light output from each of the optical fibers 42 in the array heads 44 is large, the focal depth is small; therefore, there is a problem of a reduction in image density when the distance between the recording device 14 and the thermal recording label RL changes due to a change in the thermal recording label RL which is a recording object.

Therefore, by using the fiber array unit 14b (fiber laser array light source) illustrated in FIG. 4B, FIG. 4C, or FIG. 4D, the resolution may be doubled so that images may be transferred onto the thermal recording label RL, which is a recording object, by the optical unit 43 at 1:2. Thus, the spread angle incident on the thermal recording label RL, which is a recording object, may be doubled while the resolution is kept, and therefore the focal depth becomes larger, and a reduction in image density due to changes in the distance between the recording device 14 and the thermal recording label RL, which is a recording object, may be prevented.

The image-information output unit 47, such as a personal computer, inputs image data to the controller 46. The controller 46 generates drive signals for driving each of the actuation drivers 45 on the basis of input image data. The controller 46 transmits generated drive signals to each of the actuation drivers 45. Specifically, the controller 46 includes a clock generator. When the number of clocks generated by the clock generator becomes a predetermined number of clocks, the controller 46 transmits drive signals for driving each of the actuation drivers 45 to each of the actuation drivers 45.

Each of the actuation drivers 45 drives the corresponding laser light emitting element 41 when drive signals are received. The laser light emitting element 41 emits laser light in accordance with driving of the actuation driver 45. Laser light emitted from the laser light emitting element 41 enters the corresponding optical fiber 42 to be output from the laser output portion 42a of the optical fiber 42. After being output from the laser output portion 42a of the optical fiber 42, the laser light is passed through the collimator lens 43a and the condenser lens 43b in the optical unit 43 and is then emitted to a surface of the thermal recording label RL on the container C, which is a recording object. The surface of the thermal recording label RL is irradiated with laser light and is heated so that images are recorded on the surface of the thermal recording label RL.

When the one that uses a galvanometer mirror to deflect laser and record images on a recording object is used as the recording device, images such as characters are recorded with emitted laser light as if it is written with a single stroke in accordance with rotation of the galvanometer mirror. Therefore, there is a problem in that, when a certain amount of information is recorded on a recording object, recording is delayed unless the recording object is stopped from being conveyed. Conversely, with the laser array in which the laser light emitting elements 41 are arranged in array as in the recording device 14 according to the present embodiment, images are recordable on a recording object by controlling the laser light emitting element 41 corresponding to each pixel to be turned on/off. Thus, even if the amount of information is large, images may be recorded on a recording object without stopping the container C from being conveyed. Thus, with the recording device 14 according to the present embodiment, even when a lot of information is recorded on a recording object, images are recordable without reducing productivity.

As described later, the recording device 14 according to the present embodiment emits laser light to heat a recording object so as to record images on the recording object; therefore, the used laser light emitting element 41 needs to have some degree of high output. Therefore, a large amount of heat is generated by the laser light emitting element 41. In conventional laser-array recording devices that do not include the fiber array unit 14b, the laser light emitting elements 41 need to be arranged in array with an interval that corresponds to a resolution. Therefore, in conventional laser-array recording devices, the laser light emitting elements 41 are arranged with an extremely small pitch to obtain a resolution of 200 dpi. As a result, with conventional laser-array recording devices, heat is unlikely to be released from the laser light emitting element 41, and the temperature of the laser light emitting element 41 is increased. With conventional laser-array recording devices, when the temperature of the laser light emitting element 41 is high, the wavelength or the optical output of the laser light emitting element 41 fluctuates; thus, it is difficult to heat the recording object to a specified temperature, and it is difficult to obtain desired images. Furthermore, with conventional laser-array recording devices, to prevent an increase in the temperature of the above-described laser light emitting element 41, it is necessary to have an emission interval between the laser light emitting elements 41 by decreasing the conveying speed of the recording object, and therefore it is difficult to sufficiently improve productivity.

Typically, a cooling unit often uses a chiller system and, in this system, only cooling is conducted without heating. Therefore, although the temperature of the light source is not higher than the set temperature of the chiller, the temperatures of the cooling unit 50 and the laser light emitting element 41, which is a laser light source that is in contact, fluctuate due to the ambient temperature. Furthermore, when a semiconductor laser is used as the laser light emitting element 41, there is the occurrence of a phenomenon that laser output changes in accordance with the temperature of the laser light emitting element 41 (laser output is increased when the temperature of the laser light emitting element 41 is low). To control laser output, it is preferable that the temperature of the laser light emitting element 41 or the temperature of the cooling unit 50 is measured, input signals to the actuation driver 45 are controlled in accordance with a measurement result to control laser output such that laser output is constant, and proper images are formed.

Conversely, the recording device 14 according to the present embodiment is a fiber-array recording device that uses the fiber array unit 14b. As the fiber-array recording device is used, the laser output portions 42a of the fiber array unit 14b need to be arranged with a pitch that corresponds to a resolution, and the pitch between the laser light emitting elements 41 in the laser array unit 14a does not need to be a pitch that corresponds to an image resolution. Thus, with the recording device 14 according to the present embodiment, the pitch between the laser light emitting elements 41 may be adequately wide to sufficiently release the heat of the laser light emitting element 41. Thus, the recording device 14 according to the present embodiment makes it possible to prevent a high temperature of the laser light emitting element 41 and prevent fluctuations in the wavelength or the optical output of the laser light emitting element 41. As a result, the recording device 14 according to the present embodiment allows desired images to be recorded on recording objects. Furthermore, even though an emission interval of the laser light emitting element 41 is short, an increase in the temperature of the laser light emitting element 41 may be prevented, the conveying speed of the container C may be increased, and the productivity may be improved.

Furthermore, in the recording device 14 according to the present embodiment, the cooling unit 50 is provided to cool the laser light emitting element 41 with liquid, whereby an increase in the temperature of the laser light emitting element 41 may be further prevented. As a result, the recording device 14 according to the present embodiment further enables a short emission interval of the laser light emitting element 41, an increase in the conveying speed of a container, and an improvement in productivity. Although the recording device 14 according to the present embodiment cools the laser light emitting element 41 with liquid, a cooling fan, or the like, may be used to cool the laser light emitting element 41 with air. Cooling with liquid is advantageous that a cooling efficiency is high and the laser light emitting element 41 may be cooled in a desirable manner. Conversely, cooling with air is advantageous that the laser light emitting element 41 may be cooled at low costs although a cooling efficiency is lower.

Figure 5:
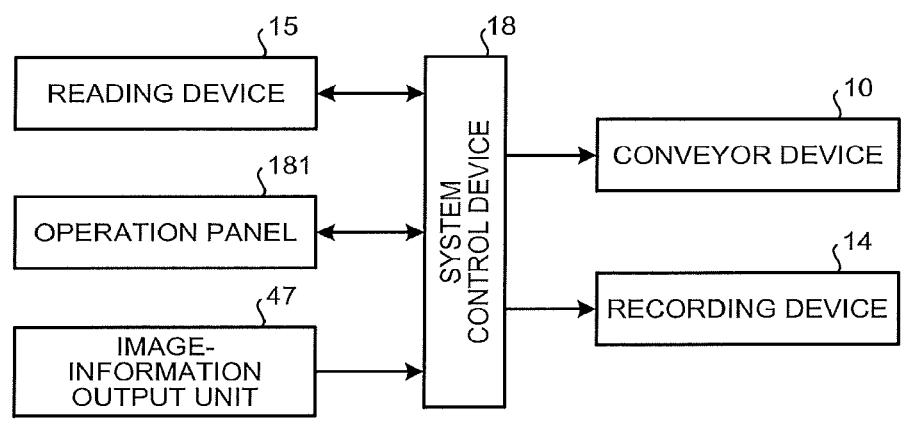
FIG. 5 is a block diagram that illustrates part of an electric circuit in the image recording system.

FIG. 5 is a block diagram that illustrates part of an electric circuit in the image recording system 100. In the drawing, the system control device 18 includes a CPU, a RAM, a ROM, a nonvolatile memory, and the like, and it controls driving of various devices in the image recording system 100 and performs various types of arithmetic processing. The system control device 18 is connected to the conveyor device 10, the recording device 14, the reading device 15, an operation panel 181, the image-information output unit 47, and the like.

The operation panel 181 includes a touch panel display and various keys, and it presents images on the display and receives various types of information input in accordance with operator's key operation.

As illustrated in FIG. 5, the CPU operates in accordance with programs stored in the ROM, or the like, so that the system control device 18 functions as an image recording unit. The system control device 18, which functions as an image recording unit, controls the recording device 14 and irradiates a recording object moving relative to the recording device 14 in a direction different from a predetermined direction with laser to heat the recording object, thereby forming image dots to record images.

Next, an example of operation of the image recording system 100 is explained with reference to FIG. 1. First, an operator places the loaded container C on the conveyor device 10. The operator places the container C on the conveyor device 10 such that the side surface of the main body of the container C with the thermal recording label RL attached thereto is located on the −Y side, that is, the side surface is opposed to the recording device 14.

After the operator operates the operation panel 181 to start the system control device 18, the operation panel 181 transmits conveyance start signals to the system control device 18. After receiving the conveyance start signal, the system control device 18 starts to drive the conveyor device 10. Then, the container C placed on the conveyor device 10 is conveyed toward the recording device 14 by the conveyor device 10. The conveying speed of the container C is, example, 2 m/sec.

A sensor that detects the container C conveyed on the conveyor device 10 is provided on the upstream side of the container C in a conveying direction with respect to the recording device 14. After the sensor detects the container C, the sensor transmits a detection signal to the system control device 18. The system control device 18 includes a timer. When a detection signal is received from the sensor, the system control device 18 starts to count time by using the timer. Then, the system control device 18 determines the time when the container C reaches the recording device 14 on the basis of the time elapsing from the receiving timing of the detection signal.

When the time elapsing from the receiving timing of the detection signal is T1 and the container C reaches the recording device 14, the system control device 18 outputs recording start signals to the recording device 14 to record an image on the thermal recording label RL attached to the container C passing by the recording device 14.

After receiving the recording start signal, the recording device 14 irradiates the thermal recording label RL on the container C moving relative to the recording device 14 with laser light with predetermined power on the basis of the image information received from the image-information output unit 47. Thus, images are recorded on the thermal recording label RL in a non-contact manner.

Images record on the thermal recording label RL (image information transmitted from an image-information output unit 47) include, for example, text images of information on details of things contained in the container C or shipping address or code images, such as bar codes or two-dimensional codes, obtained by coding information on details of things contained in the container C or shipping addresses.

After an image is recorded on the container C while passing by the recording device 14, it is passed by the reading device 15. Here, the reading device 15 reads code images such as bar codes or two-dimensional codes recorded on the thermal recording label RL, thereby acquiring information such as details of things contained in the container C or information on shipping addresses. The system control device 18 compares information acquired from the code image with the image information transmitted from the image-information output unit 47 to check whether the image is properly recorded. When the image is properly recorded, the system control device 18 conveys the container C with the conveyor device 10 to the subsequent process (e.g., a delivery preparation process).

Conversely, when the image is not properly recorded, the system control device 18 temporarily stops the conveyor device 10 and causes the operation panel 181 to present the message that the image is not properly recorded. Furthermore, when the image is not properly recorded, the system control device 18 may convey the container C to a specified delivery destination.

Figure 6A:
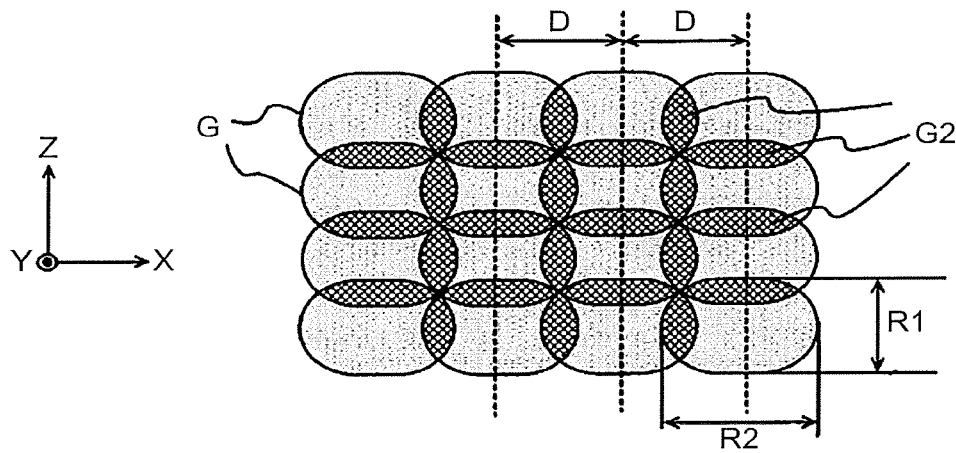
FIG. 6A is a diagram that illustrates recording of a solid image on a recording object.
Figure 6B:
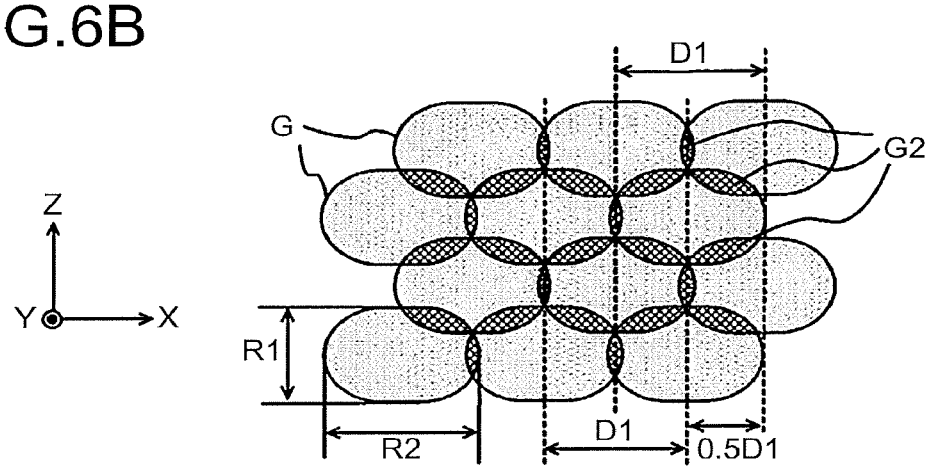
FIG. 6B is a diagram that illustrates recording of a solid image on a recording object.
Figure 6C:
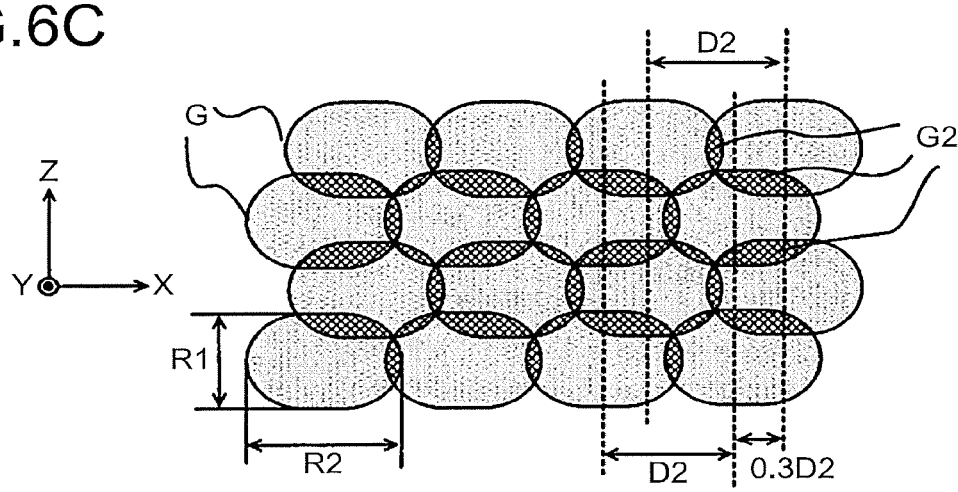
FIG. 6C is a diagram that illustrates recording of a solid image on a recording object.

FIG. 6A to FIG. 6C are diagrams that illustrate recording of a solid image on a recording object. FIG. 6A is a diagram that illustrates an example of solid image formation where laser light is output from each of the laser light emitting elements 41 in identical timing. FIG. 6B and FIG. 6C are diagrams that illustrate examples of solid image formation where the laser output timing of the laser light emitting element 41 that corresponds to the odd-numbered optical fiber 42, counted from one side along the Z-axis direction, is different from the laser output timing of the laser light emitting element 41 that corresponds to the even-numbered optical fiber 42. FIG. 6B is an example of solid image formation where the laser output timing of the laser light emitting element 41 that corresponds to the even-numbered optical fiber 42 is delayed by half a sub-scanning direction (X-axis direction) pitch D1 (D1/2) of image dots G. FIG. 6C is an example of solid image formation where the laser output timing of the laser light emitting element 41 that corresponds to the even-numbered optical fiber 42 is delayed by approximately one third of a sub-scanning direction (X-axis direction) pitch D2 (0.3D2) of the image dots G. Here, solid images refer to images where the image dots G, equal to or more than two dots, are successive in both the Z-axis direction and the X-axis direction.

When a solid image is formed such that the image dot G is not overlapped with image dots that are adjacent in the X-axis direction, there are voids in the solid image. Therefore, when a solid image is formed to prevent voids, the image dot G needs to be recorded on a recording object such that it is overlapped with all the adjacent image dots G. As it is understood from comparison between FIG. 6A and FIG. 6B, if the image dot G is overlapped with all adjacent image dots to prevent voids, an area G2 where the image dots G are overlapped is wider when laser light is output from each of the laser light emitting elements 41 in identical timing. The area G2 where the image dots G are overlapped with one another is an area that receives excessive heat energy due to irradiation of laser. Receiving such excessive heat energy sometimes causes a reduction in recording density of the recording object and burning of the recording object.

The area G2 where the image dots G are overlapped with one another in FIG. 6A is wider than those in FIG. 6B and FIG. 6C. Therefore, when a solid image is formed with the identical output timing of laser light from each of the laser light emitting elements 41, there is a reduction in the recording density or burning of the recording object as compared with a case where the laser output timings of the odd-numbered and the even-numbered are different as illustrated in FIG. 6B.

As illustrated in FIG. 6B or FIG. 6C, due to a difference between the output timings of laser from the odd-numbered and the even-numbered laser light emitting elements 41, the number of adjacent image dots is increased, 6 at a maximum; however, the area G2 where the image dots G are overlapped with each other is narrower. This results in prevention of a reduction in recording density or burning at the area G2 where the image dots G are overlapped and suppression of voids in a solid image.

The amount of shift between the laser output timing of the odd-numbered laser light emitting element 41 and the laser output timing of the even-numbered laser light emitting element 41 may be appropriately determined based on the size of the image dot G or the pitch P of the image dot G in the Z-axis direction. However, as illustrated in FIG. 6B, at least the identical sub-scanning direction (X-axis direction) pitch is set for the image dot G recorded with laser light from the odd-numbered laser light emitting element 41 and the image dot G recorded with laser light from the even-numbered laser light emitting element 41, and a phase is shifted for the sub-scanning direction pitch approximately by ½ of the pitch for the even-numbered and the odd-numbered, whereby an area where image dots are overlapped may be smallest, and voids may be prevented.

Next, verification experiments conducted by the applicant is explained.

Example 1

According to an example 1, the laser output timing of the laser light emitting element 41 that corresponds to the even-numbered optical fiber 42, counted from one side along the Z-axis direction, is shifted by a 0.3 pitch in the sub-scanning direction with respect to the laser output timing of the laser light emitting element 41 that corresponds to the odd-numbered optical fiber 42 so that the solid image is recorded as illustrated in FIG. 6C. The 32 array heads 44 holding the optical fibers 42 (the fiber core diameter is 105 μm, the fiber diameter is 125 μm, and the spread angle (NA) of output laser light is 0.11) constitute the fiber array unit 14b (fiber laser array light source) in the recording device 14. Furthermore, an experiment is conducted by using, as the optical unit 43, a lens system that transfers images on the thermal recording label RL attached to the container C for transport, which is a recording object, with laser lights output from the respective optical fibers 42 in the array heads 44 at 1:1.

The laser output portions 42a of the respective optical fibers 42 are set such that a dot pitch in the main scanning (Z axis) direction is 127 μm and a dot pitch in the sub-scanning (X axis) direction is 140 μm.

Furthermore, the size of the image dot G transferred onto the thermal recording label RL attached to the container C for transport, which is a recording object, is set such that a length R1 in the Z-axis direction is 150 μm and a length R2 in the X-axis direction is 185 µm. Specifically, the length R1 in the Z-axis direction and the length R2 in the X-axis direction of the image dot G, recorded on the thermal recording label RL attached to the container C for transport, which is a recording object, are measured by a micro digital meter and, in accordance with a measurement result, a laser power and a laser irradiation time of the laser light emitting element 41 are adjusted such that R1=150 µm and R2=185 µm. Here, the average values of the maximum and the minimum image density are calculated, and the outline area of the image with the average value is determined and measured as the image dot G.

Example 2

An example 2 is the same as the example 1 except that the laser output timing of the laser light emitting element 41 that corresponds to the odd-numbered optical fiber 42, counted from one side along the Z-axis direction, and the laser output timing of the laser light emitting element 41 that corresponds to the even-numbered optical fiber 42 are shifted in the sub-scanning direction by a 0.5 pitch (75 µm), and the solid image is recorded as illustrated in FIG. 6B.

Comparative Example 1

A comparative example 1 is the same as the example 1 except that the laser output timing of each of the laser light emitting elements 41 is identical timing, and the above-described solid image illustrated in FIG. 6A is recorded. Solid images recorded according to the examples 1 and 2 and the comparative example 1 described above are visually examined. When no voids are identified, "AA" is set, when voids are not noticeable, "B", and when voids are noticeable, "NG". Furthermore, when no burning is identified on a recording object, "AA" is set, when burning is not noticeable, "B", and when burning is noticeable, "NG". These results are illustrated in a table 1.

TABLE 1

|  | Void | Burning |
|---|---|---|
| Example 1 | AA | B |
| Example 2 | AA | AA |
| Comparative Example 1 | AA | NG |

According to the comparative example 1, although no voids are identified, there are noticeable areas with local burning or decreased density on the thermal recording label RL attached to the container C for transport, which is a recording object.

Conversely, according to the examples 1 and 2, no voids are identified in the solid image, and areas with burning or decreased density are not noticeable or not visually identified on the thermal recording label RL attached to the container C for transport, which is a recording object.

Furthermore, according to the example 1, when the position of the thermal recording label RL attached to the container C for transport, which is a recording object, is moved toward the optical unit 43, the measured allowable range within which the image density is not visually decreased is 1.0 mm.

Example 3

Next, an experiment is conducted by using the fiber array unit 14b (fiber laser array light source), illustrated in FIG. 4E, manufactured with a pitch of 0.0635 µm and, as the optical unit 43, the lens system that transfers images at 1:2 with laser lights output from the respective optical fibers 42 in the array heads 44.

The laser output portions 42a of the respective optical fibers 42 are set such that a dot pitch in the main scanning (z axis) direction is 127 µm and a dot pitch in the sub-scanning (X axis) direction is 140 µm.

Furthermore, the size of the image dot G transferred on the thermal recording label RL attached to the container C for transport, which is a recording object, is set such that the length R1 in the Z-axis direction is 150 µm and the length R2 in the X-axis direction is 185 µm. Specifically, the length R1 in the Z-axis direction and the length R2 in the X-axis direction of the image dot G, recorded on the thermal recording label RL attached to the container C for transport, which is a recording object, are measured by a micro digital meter and, in accordance with a measurement result, a laser power and a laser irradiation time of the laser light emitting element 41 are adjusted such that R1=150 µm and R2=185 µm.

Furthermore, according to the example 3, when the position of the thermal recording label RL attached to the container C for transport, which is a recording object, is moved toward the optical unit 43, the measured allowable range within which the image density is not visually decreased is 2.3 mm.

Modification 1

Figure 7A:
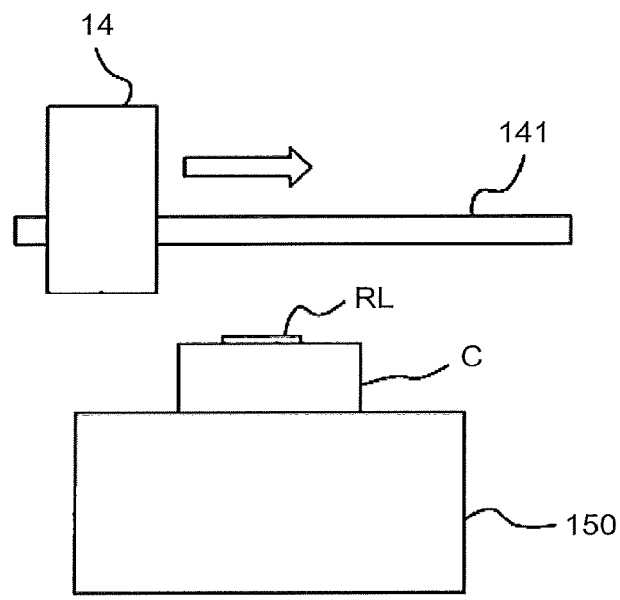
FIG. 7A is a diagram that illustrates an example of the image recording system according to a modification 1.
Figure 7B:
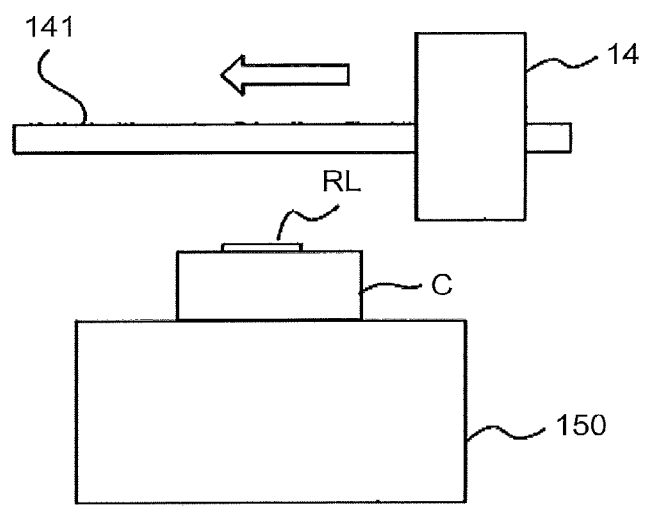
FIG. 7B is a diagram that illustrates an example of the image recording system according to the modification 1.

FIG. 7A and FIG. 7B are diagrams that illustrate an example of the image recording system 100 according to a modification 1.

According to the modification 1, images are recorded on the thermal recording label RL, which is a recording object, of the container C when the recording device 14 is moved.

As illustrated in FIG. 7A and FIG. 7B, the image recording system 100 according to the modification includes a placement board 150 on which the container C is placed. The recording device 14 is supported by a rail member 141 such that it is movable in a horizontal direction in the drawing.

According to the modification 1, first, an operator places the container C on the placement board 150 such that the surface of the container C where the thermal recording label RL, which is a recording object, is attached is on the top surface. After the container C is placed on the placement board 150, the operation panel 181 is operated to start image recording processing. After the image recording processing is started, the recording device 14 located on the left side illustrated in FIG. 7A moves to the right side in the drawing as indicated by the arrow of FIG. 7A. Then, the recording device 14 irradiates the recording object (the thermal recording label RL of the container C) with laser to record an image while moving to the right side in the drawing. After the image is recorded, the recording device 14 located on the right side illustrated in FIG. 7B moves to the left side in the drawing as indicated by the arrow of FIG. 7B to return to the position illustrated in FIG. 7A.

Furthermore, an explanation is given above of an example where the present invention is applied to the recording device 14 that records images on the thermal recording label RL attached to the container C; however, the present invention is applicable to, for example, an image rewriting system that rewrites images on a reversible thermal recording label attached to the container C. In this case, a deleting device is provided on the upstream side of the container C in a conveying direction with respect to the recording device 14 to delete images recorded on a reversible thermal recording label by irradiating the reversible thermal recording label with laser. After the deleting device deletes images recorded on the reversible thermal recording label, the recording device 14 records images. This image rewriting system is also capable of suppressing voids in solid images and preventing burning of recording objects.

Furthermore, although an explanation is given of the recording device 14 that uses a fiber array, it is also possible that semiconductor lasers are arranged in array with a pixel pitch and a recording object is irradiated with laser light from the semiconductor lasers without passing through any optical fibers to record images.

Examples are explained above, and they have a particular advantage for the respective aspects described below.

Aspect 1

A laser irradiation device, such as the recording device 14, is provided to emit laser lights output from the laser light emitting elements 41, such as semiconductor lasers, to different positions in a predetermined direction, an image recording unit is provided to control the laser irradiation device to irradiate a recording object moving relative to the laser irradiation device in a direction different from the predetermined direction with laser so as to heat the recording object, form image dots, and record an image, and the image recording unit controls the laser irradiation device, conducts recording such that at least one of the image dots, recorded alongside at different positions in a direction perpendicular to a relative moving direction of the recording object, is shifted relative to the other image dots in the relative moving direction, and records a solid image on the recording object such that the image dot is partially overlapped with all adjacent image dots.

Image dots recorded on a recording object due to irradiation of laser have substantially an oval shape. When a solid image is formed on a recording object such that image dots are adjacent to one another, void areas occur in the solid image due to an oval shape of image dots (see FIG. 8). For this reason, when a solid image is recorded, an image dot is overlapped with all adjacent image dots. Thus, as explained above with reference to FIG. 6A, voids on a solid image may be prevented. However, when image dots are overlapped to prevent voids on a solid image, image dots are overlapped in large areas. On the areas where image dots are overlapped, recording density is reduced or burning occurs due to excessive irradiation of laser. Therefore, when the total size of areas where image dots are overlapped and laser is repeatedly emitted is large, a reduction in the recording density and burning are accordingly noticeable.

Therefore, according to the aspect 1, recording is conducted such that at least one of the image dots, recorded alongside at different positions in a direction perpendicular to the relative moving direction of the recording object, is shifted relative to the other image dots in the relative moving direction, and a solid image is recorded such that the image dot is partially overlapped with all adjacent image dots.

Figure 8:
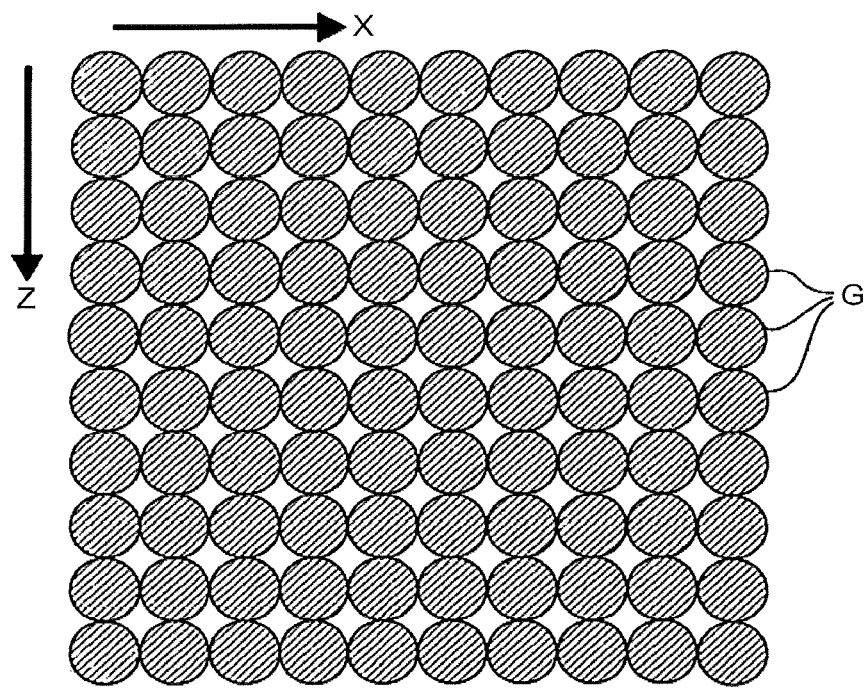
FIG. 8 is a diagram that illustrates a solid image formed such that an image dot is not overlapped with adjacent image dots in the X-axis direction.

Thus, the solid image recorded on the recording object as illustrated above in FIG. 6B is a solid image recorded with voids reduced as compared with the solid image formed on the recording object such that the image dots are adjacent to one another as illustrated in FIG. 8. Furthermore, the areas where the image dots are overlapped may be smaller as compared with the solid image, illustrated in FIG. 6A, where the output timing of laser output from each laser output portion is identical so that all image dots, recorded alongside at different positions in a direction perpendicular to the relative moving direction of the recording object, are formed at identical positions in the relative moving direction to prevent voids on the solid image. Thus, voids on a solid image may be prevented, and a reduction in recording density or burning due to excessive irradiation of laser to a recording object may be prevented. Furthermore, the resolution of images recorded on a recording object may be improved, and a reduction in image density due to changes in the distance between the image recording device and a recording object may be prevented.

Aspect 2

According to the aspect 1, the image recording unit controls the laser irradiation device and forms a solid image such that the laser output timing of the laser light emitting element that corresponds to an odd-numbered image dot, counted from one side along the predetermined direction, is different from the laser output timing of the laser light emitting element that corresponds to an even-numbered image dot.

Thus, as explained with reference to FIG. 6, voids on a solid image may be prevented, and a reduction in recording density and burning due to excessive irradiation of laser to a recording object may be prevented.

Aspect 3

According to the aspect 2, the image recording unit controls the laser irradiation device, sets a pitch of the odd-numbered image dot, counted from one side along the predetermined direction, in the relative moving direction to be identical to a pitch of the even-numbered image dot in the relative moving direction, and shifts the even-numbered image dot relative to the odd-numbered image dot in the relative moving direction by ½ of the pitch.

Thus, as explained with the verification experiments, an image dot may be overlapped with all adjacent image dots so that voids may be prevented, and a reduction in recording density and burning due to excessive irradiation of laser to a recording object may be further prevented.

Aspect 4

According to the aspect 1 or the aspect 3, optical fibers are provided corresponding to the laser light emitting elements and they guide laser lights output from the laser light emitting elements to the recording object, and laser output portions of the optical fibers are held in array in the predetermined direction.

Therefore, as explained in the embodiment, the laser output portions of the respective optical fibers need to be arranged at the pitch that is identical to the pixel pitch of visible images, and the laser light emitting elements, such as semiconductor lasers, do not need to be arranged at the pitch that is identical to the pixel pitch. Thus, the laser light emitting elements may be arranged to release heat of the laser light emitting elements, whereby an increase in the temperature of the laser light emitting elements may be prevented. Thus, fluctuations in the wavelength or the optical output of the laser light emitting elements may be prevented, and desired images may be recorded on a recording object.

Aspect 5

According to any one of the aspect 1 to the aspect 4, the image recording unit controls irradiation power of laser light in accordance with the temperature of the laser light emitting element, thereby correcting optical output. Thus, fluctuations in optical output due to the temperature of the laser light emitting element may be corrected and reduced, and desired images may be recorded on a recording object.

Aspect 6

In the image recording method for recording images on a recording object by using an image recording device, the image recording device according to any one of the aspect 1 to the aspect 5 is used as the image recording device. Thus, voids on a solid image may be prevented, and the occurrence of an area with decreased image density and burning of a recording object may be prevented.

The image recording device according to the embodiment invention has an advantage such that it is possible to prevent voids on solid images, prevent the occurrence of an area where its image density is low or burning of a recording object, improve the resolution of images recorded on a recording object, and prevent a decrease in the image density due to changes in the distance between the image recording device and a recording object.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

What is claimed is:

1. An image recording device comprising:
    a laser irradiation source configured to emit laser lights output from a plurality of laser light emitting elements to different positions in a predetermined direction; and
    image recording circuitry configured to control the laser irradiation device to irradiate a recording object moving relative to the laser irradiation device in a direction different from the predetermined direction with laser so as to heat the recording object, form image dots, and record an image, wherein
    the image recording circuitry
        controls the laser irradiation source,
        conducts recording such that at least one of the image dots, recorded alongside at different positions in a direction perpendicular to a relative moving direction of the recording object, is shifted relative to other ones of the image dots in the relative moving direction, and
        records a solid image on the recording object such that the image dot is partially overlapped with all adjacent image dots including an adjacent dot shifted relative to the image dot in both the relative moving direction and the direction perpendicular to the relative moving direction.

2. The image recording device according to claim 1, wherein the image recording circuitry:
    controls the laser irradiation source, and
    forms a solid image such that laser output timing of the laser light emitting element that corresponds to an odd-numbered image dot, counted from one side along the predetermined direction, is different from laser output timing of the laser light emitting element that corresponds to an even-numbered image dot.

3. The image recording device according to claim 2, wherein the image recording circuitry:
    controls the laser irradiation source,
    sets a pitch of the odd-numbered image dot, counted from one side along the predetermined direction, in the relative moving direction to be identical to a pitch of the even-numbered image dot in the relative moving direction, and
    shifts the even-numbered image dot relative to the odd-numbered image dot in the relative moving direction by ½ of the pitch.

4. The image recording device according to claim 1, wherein:
    the laser irradiation source includes optical fibers that are provided corresponding to the laser light emitting elements and that guide laser lights output from the laser light emitting elements to the recording object, and laser output portions of the optical fibers are held in array in the predetermined direction.

5. The image recording device according to claim 1, wherein:
    the image recording circuitry controls irradiation power of the laser light in accordance with a temperature of the laser light emitting element.

6. An image recording method for recording an image on a recording object by using an image recording device, wherein the image recording device according to claim 1 is used as the image recording device.

7. The image recording device according to claim 1, wherein:
    the image recording circuitry records the solid image such that image dots at a same position in the relative moving direction are separated from each other in the direction perpendicular to the relative moving direction.

8. The image recording device according to claim 1, wherein the recording object is a thermal recording medium including dye which is activated by heat from the laser lights.

9. The image recording device according to claim 1, wherein the laser irradiation source irradiates light on the recording object without the light reflecting off of a mirror.

10. The image recording device according to claim 1, wherein the laser irradiation source irradiates light on the recording object without the light reflecting off of a moving mirror.

11. The image recording device according to claim 1, wherein the laser irradiation source irradiates light on the recording object without the light reflecting off of a rotating mirror.

12. The image recording device according to claim 1, wherein the laser irradiation source irradiates light on the recording object which is one of a package, a box, and a container.

13. A method of recording, comprising:
    emitting laser lights output from a plurality of laser light emitting elements to different positions; and
    controlling the emitting to irradiate a recording object so as to heat the recording object, form image dots, and record an image,
    wherein the controlling controls the emitting such that an image is recorded on the recording object such that a least one of the image dots is partially overlapped with all adjacent image dots including an adjacent dot shifted relative to the at least one of the image dots in both a first direction and a second direction perpendicular to the first direction.

14. The method according to claim 13, wherein the laser lights are emitted on the recording object which is a thermal recording medium including dye which is activated by heat from the laser lights.

15. The method according to claim 13, wherein the laser lights are emitted on the recording object without the light reflecting off of a mirror.

16. The method according to claim 13, wherein the laser lights are emitted on the recording object without the light reflecting off of a moving mirror.

17. The method according to claim 13, wherein the laser lights are emitted on the recording object without the light reflecting off of a rotating mirror.

18. The method according to claim 13, wherein the laser lights are emitted on the recording object which is one of a package, a box, and a container.

19. The method according to claim 13, wherein the laser lights are emitted on the recording object which is a label on one of a package, a box, and a container.

20. An image recording device comprising:
a laser irradiation source configured to emit laser lights output from a plurality of laser light emitting elements to different positions, the laser irradiation source including a plurality of optical fibers connected between an array head and the plurality of laser light emitting elements;
a collimator lens which receives light from the array head;
a condenser lens which receives light from the collimator lens and outputs light to a recording object; and
image recording circuitry configured to control the laser irradiation source to irradiate the recording object moving relative to the laser irradiation source in a direction different from the predetermined direction with laser so as to heat the recording object, form image dots, and record an image, wherein
the image recording circuitry
controls the laser irradiation source,
conducts recording such that at least one of the image dots, recorded alongside at different positions in a direction perpendicular to a relative moving direction of the recording object, is shifted relative to other ones of the image dots in the relative moving direction, and
records a solid image on the recording object such that the image dot is partially overlapped with all adjacent image dots.

* * * * *